US011326253B2

(12) United States Patent
Fenwick et al.

(10) Patent No.: US 11,326,253 B2
(45) Date of Patent: May 10, 2022

(54) ATOMIC LAYER DEPOSITION OF PROTECTIVE COATINGS FOR SEMICONDUCTOR PROCESS CHAMBER COMPONENTS

(71) Applicant: Applied Materials, Inc., Santa Clara, CA (US)

(72) Inventors: David Fenwick, Los Altos, CA (US); Jennifer Y. Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/495,624

(22) Filed: Apr. 24, 2017

(65) Prior Publication Data

US 2017/0314125 A1 Nov. 2, 2017

Related U.S. Application Data

(60) Provisional application No. 62/328,588, filed on Apr. 27, 2016.

(51) Int. Cl.
*C23C 16/44* (2006.01)
*C23C 16/40* (2006.01)
(Continued)

(52) U.S. Cl.
CPC ......... *C23C 16/4404* (2013.01); *C23C 16/40* (2013.01); *C23C 16/403* (2013.01);
(Continued)

(58) Field of Classification Search
CPC ................ H01J 37/32477; H01J 37/32495
See application file for complete search history.

(56) References Cited

U.S. PATENT DOCUMENTS

| 5,630,314 A | 5/1997 | Kojima et al. |
| 5,805,973 A | 9/1998 | Coffinberry |

(Continued)

FOREIGN PATENT DOCUMENTS

| CN | 1655362 A | 8/2005 |
| CN | 1906026 A | 1/2007 |

(Continued)

OTHER PUBLICATIONS

Putkonen (Chemical Vapor Deposition 2001, 7, 44-50).*
(Continued)

*Primary Examiner* — Joel G Horning
(74) *Attorney, Agent, or Firm* — Lowenstein Sandler LLP

(57) ABSTRACT

A multi-component coating composition for a surface of a semiconductor process chamber component comprising at least one first film layer of a yttrium oxide or a yttrium fluoride coated onto the surface of the semiconductor process chamber component using an atomic layer deposition process and at least one second film layer of an additional oxide or an additional fluoride coated onto the surface of the semiconductor process chamber component using an atomic layer deposition process, wherein the multi-component coating composition is selected from the group consisting of $YO_xF_y$, $YAl_xO_y$, $YZr_xO_y$, and $YZr_xAl_yO_z$.

19 Claims, 7 Drawing Sheets

(51) Int. Cl.
　　　*C23C 16/455*　　(2006.01)
　　　*C23C 28/04*　　(2006.01)

(52) U.S. Cl.
　　　CPC ........ *C23C 16/405* (2013.01); *C23C 16/4408* (2013.01); *C23C 16/45529* (2013.01); *C23C 16/45531* (2013.01); *C23C 28/042* (2013.01)

(56) References Cited

U.S. PATENT DOCUMENTS

| | | |
|---|---|---|
| 5,840,434 A | 11/1998 | Kojima et al. |
| 6,139,983 A | 10/2000 | Ohashi et al. |
| 6,548,424 B2 | 4/2003 | Putkonen |
| 6,632,549 B1 | 10/2003 | Ohashi et al. |
| 6,641,941 B2 | 11/2003 | Yamada et al. |
| 6,685,991 B2 | 2/2004 | Wataya et al. |
| 6,777,353 B2 | 8/2004 | Putkonen |
| 6,858,332 B2 | 2/2005 | Yamada |
| 6,858,546 B2 | 2/2005 | Niinisto et al. |
| 6,916,534 B2 | 7/2005 | Wataya et al. |
| 7,138,192 B2 | 11/2006 | Yamada et al. |
| 7,351,658 B2 | 4/2008 | Putkonen |
| 7,384,696 B2 | 6/2008 | Hayasaki et al. |
| 7,498,272 B2 | 3/2009 | Niinisto et al. |
| 7,560,376 B2 | 7/2009 | Escher et al. |
| 7,569,280 B2 | 8/2009 | Havasaki et al. |
| 7,696,117 B2 | 4/2010 | Sun et al. |
| 7,754,621 B2 | 7/2010 | Putkonen |
| 7,780,786 B2 | 8/2010 | Mitsuhashi et al. |
| 7,968,205 B2 | 6/2011 | Nakano et al. |
| 7,998,883 B2 | 8/2011 | Putkonen |
| 8,399,862 B2 | 3/2013 | Ohmi et al. |
| 8,619,406 B2 | 12/2013 | Cho et al. |
| 8,858,745 B2 | 10/2014 | Sun et al. |
| 8,916,021 B2 | 12/2014 | Sun et al. |
| 9,012,030 B2 | 4/2015 | Han et al. |
| 9,023,427 B2 | 5/2015 | Matero et al. |
| 9,090,046 B2 | 7/2015 | Sun et al. |
| 9,343,289 B2 | 5/2016 | Sun et al. |
| 9,394,615 B2 | 7/2016 | Sun et al. |
| 9,440,886 B2 | 9/2016 | Sun et al. |
| 9,551,070 B2 | 1/2017 | Chang et al. |
| 9,617,188 B2 | 4/2017 | Sun et al. |
| 9,617,633 B2 | 4/2017 | He et al. |
| 9,633,884 B2 | 4/2017 | He et al. |
| 9,850,573 B1 | 12/2017 | Sun |
| 10,186,400 B2 | 1/2019 | Wu et al. |
| 10,573,497 B2 | 2/2020 | Wu et al. |
| 2002/0115252 A1 | 8/2002 | Haukka et al. |
| 2002/0177001 A1 | 11/2002 | Harada et al. |
| 2003/0029563 A1* | 2/2003 | Kaushal ............. C23C 16/4404 156/345.1 |
| 2003/0051811 A1 | 3/2003 | Uchimaru et al. |
| 2003/0127049 A1 | 7/2003 | Han et al. |
| 2004/0023811 A1 | 2/2004 | Iijima |
| 2004/0033385 A1 | 2/2004 | Kaushal et al. |
| 2005/0037536 A1 | 2/2005 | Lai |
| 2005/0151184 A1 | 7/2005 | Lee et al. |
| 2005/0227118 A1 | 10/2005 | Uchimaru et al. |
| 2006/0037536 A1 | 2/2006 | Kobayashi et al. |
| 2006/0040508 A1 | 2/2006 | Ji et al. |
| 2006/0073354 A1 | 4/2006 | Watanabe et al. |
| 2006/0202621 A1 | 9/2006 | Yoo |
| 2008/0066647 A1 | 3/2008 | Harada et al. |
| 2008/0213496 A1 | 9/2008 | Sun et al. |
| 2008/0254231 A1 | 10/2008 | Lin et al. |
| 2008/0264565 A1 | 10/2008 | Sun et al. |
| 2009/0194233 A1* | 8/2009 | Tamura ............. C23C 16/4404 156/345.1 |
| 2010/0119843 A1* | 5/2010 | Sun ............. H01J 37/32477 428/426 |
| 2010/0119844 A1 | 5/2010 | Sun et al. |
| 2010/0129670 A1 | 5/2010 | Sun et al. |
| 2010/0323124 A1 | 12/2010 | Vartabedian et al. |
| 2011/0008955 A1 | 1/2011 | Horii et al. |
| 2011/0091700 A1 | 4/2011 | Simpson |
| 2012/0135155 A1 | 5/2012 | Han et al. |
| 2012/0138472 A1* | 6/2012 | Han ............. C23C 16/4404 205/170 |
| 2013/0154059 A1 | 6/2013 | Ohmi et al. |
| 2014/0116338 A1 | 5/2014 | He et al. |
| 2014/0120312 A1 | 5/2014 | He et al. |
| 2014/0159325 A1 | 6/2014 | Parkhe et al. |
| 2015/0004418 A1 | 1/2015 | Sun et al. |
| 2015/0021324 A1 | 1/2015 | Sun et al. |
| 2015/0024155 A1 | 1/2015 | Sun et al. |
| 2015/0061237 A1 | 3/2015 | Sun et al. |
| 2015/0064450 A1 | 3/2015 | Sun et al. |
| 2015/0152540 A1 | 6/2015 | Sato et al. |
| 2015/0158775 A1 | 6/2015 | Sun et al. |
| 2015/0201461 A1 | 7/2015 | Duan et al. |
| 2015/0270108 A1 | 9/2015 | Sun et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329955 A1 | 11/2015 | Sun et al. |
| 2016/0076129 A1 | 3/2016 | Nagayama et al. |
| 2016/0079040 A1 | 3/2016 | Park et al. |
| 2016/0181627 A1 | 6/2016 | Roeder et al. |
| 2016/0211121 A1 | 7/2016 | Sun et al. |
| 2016/0254125 A1 | 9/2016 | Huang et al. |
| 2016/0273095 A1 | 9/2016 | Lin et al. |
| 2016/0281230 A1 | 9/2016 | Varadarajan et al. |
| 2016/0312351 A1 | 10/2016 | Liu et al. |
| 2016/0326625 A1 | 11/2016 | Sun et al. |
| 2016/0326626 A1 | 11/2016 | Sun et al. |
| 2016/0336210 A1 | 11/2016 | Cooke |
| 2016/0358749 A1 | 12/2016 | Sant |
| 2016/0375515 A1 | 12/2016 | Xu et al. |
| 2016/0379806 A1 | 12/2016 | Xu et al. |
| 2017/0010969 A1 | 1/2017 | Chiu et al. |
| 2017/0022595 A1 | 1/2017 | Sato et al. |
| 2017/0110293 A1 | 4/2017 | Sun et al. |
| 2017/0140969 A1 | 5/2017 | Kuo |
| 2017/0314125 A1 | 11/2017 | Fenwick et al. |
| 2018/0044800 A1 | 2/2018 | Hendrix et al. |

FOREIGN PATENT DOCUMENTS

| | | |
|---|---|---|
| CN | 101218376 A | 7/2008 |
| CN | 101418435 A | 4/2009 |
| CN | 102575345 A | 7/2012 |
| CN | 103215535 A | 7/2013 |
| CN | 104715993 A | 6/2015 |
| CN | 105074889 A | 11/2015 |
| CN | 105088141 A | 11/2015 |
| CN | 105225997 A | 1/2016 |
| CN | 207193391 U | 4/2018 |
| JP | H03115535 | 5/1991 |
| JP | 2006082474 | 3/2006 |
| JP | 2007131951 | 5/2007 |
| JP | 2007217782 | 8/2007 |
| JP | 2012159133 A | 8/2012 |
| KR | 20110037282 A | 4/2011 |
| KR | 20170044396 | 4/2017 |
| WO | 03089682 A1 | 10/2003 |
| WO | 2007115029 A2 | 10/2007 |
| WO | 2013032260 | 3/2013 |
| WO | 2013032809 A1 | 3/2013 |
| WO | 2014205212 A1 | 12/2014 |
| WO | 2015120265 | 8/2015 |

OTHER PUBLICATIONS

Pilvi (Chemical Vapor Deposition 2009, 15, 27-32).*
Ginestra (Electrochemical and Solid-State Letters, 10 (10) B161-B165 (2007)) (Year: 2007).*
Johansson, P. et al., "Atomic Layer Deposition Process for Barrier Applications of Flexible Packaging," 2010 Place Conference, Apr. 18-21, 2010, 33 pages, Albequerque, New Mexico.

(56) References Cited

OTHER PUBLICATIONS

Rowland, J.C. "Atomic Layer Depositions of the Al2O3-Y2O3 Pseudo-Binary System", Doctoral Disertation, University of Florida, ProQuest LLC, 2010, pp. 1-106.
Japanese Office Action and English Translation thereof for Japanese patent application No. 2017-250741, dated Feb. 16, 2021, 7 pages.
Japanese Office Action and English Translation thereof for Japanese patent application No. 2017-086912, dated Feb. 16, 2021, 11 pages.
Chinese Office Action and English Translation thereof for Chinese patent application No. 201910516222, dated Jan. 13, 2021, 13 pages.
Sanghoon Ji et al., "Fabrication of low-temperature solid oxide fuel cells with a nanothin protective layer by atomic layer deposition"; Nanoscale Research Letters, Jan. 23, 2013, vol. 8, No. 48, 7 pages.

\* cited by examiner

US 11,326,253 B2

ATOMIC LAYER DEPOSITION OF PROTECTIVE COATINGS FOR SEMICONDUCTOR PROCESS CHAMBER COMPONENTS

RELATED APPLICATIONS

This application claims priority to U.S. Provisional Patent Application 62/328,588, filed Apr. 27, 2016, which is herein incorporated by reference.

TECHNICAL FIELD

Embodiments of the present disclosure relate to a method for preparing a protective coating for semiconductor process chamber components using atomic layer deposition (ALD), a multi-component protective coating, and a semiconductor process chamber component coated with a multi-component protective coating.

BACKGROUND

Various manufacturing processes expose semiconductor process chamber components to high temperatures, high energy plasma, a mixture of corrosive gases, high stress, and combinations thereof. These extreme conditions may erode the chamber components, corrode the chamber components, and increase the chamber components' susceptibility to defects. It is desirable to reduce these defects and improve the components' erosion and/or corrosion resistance in such extreme environments. Coating semiconductor process chamber components with protective coatings is an effective way to reduce defects and extend their durability.

Protective coating films are typically deposited on chamber components by a variety of methods, such as thermal spray, sputtering, or evaporation techniques. In these techniques, the surfaces of the chamber components that are not directly exposed to the vapor source (e.g., are not in a line of sight of a material source) are coated with either a significantly thinner film than surfaces that are directly exposed to the vapor source, poor quality film, a low-density film, or not coated at all.

SUMMARY

Some embodiments of the present invention cover a method for forming a multi-component coating composition on a semiconductor process chamber component. The method includes depositing a first film layer of a yttrium oxide or a yttrium fluoride onto a surface of a semiconductor process chamber component, wherein the first film layer is grown from at least two precursors using an atomic layer deposition process. The method further includes depositing a second film layer of an additional oxide or an additional fluoride onto the surface of the semiconductor process chamber component, wherein the second film layer is grown from at least two additional precursors using the atomic layer deposition process. The method further includes forming a multi-component composition comprising the first film layer and the second film layer. In some embodiments, the method may further include depositing at least one additional film layer, the at least one additional film layer comprising aluminum oxide or zirconium oxide, wherein the at least one additional film layer is grown from at least two additional precursor using the atomic layer deposition process.

In some embodiments, the present invention covers a coated semiconductor process chamber component. The coated semiconductor process chamber component may comprise a semiconductor process chamber component having a surface and a multi-component coating coated on the surface. In certain embodiments, the multi-component coating may comprise at least one first film layer of a yttrium oxide or a yttrium fluoride coated onto the surface using an atomic layer deposition process and at least one second film layer of an additional oxide or an additional fluoride coated onto the surface using an atomic layer deposition process. In some embodiments, the multi-component coating may further comprise at least one additional film layer comprising aluminum oxide or zirconium oxide coated onto the surface using an atomic layer deposition process.

In some embodiments, the present invention covers a multi-component coating composition for a surface of a semiconductor process chamber component. The multi-component coating composition may comprise at least one first film layer of a yttrium oxide or a yttrium fluoride coated onto the surface of the semiconductor process chamber component using an atomic layer deposition process and at least one second film layer of an additional oxide or an additional fluoride coated onto the surface of the semiconductor process chamber component using an atomic layer deposition process. The multi-component coating composition may be selected from the group consisting of $YO_xF_y$, $YAl_xO_y$, $YZr_xO_y$, and $YZr_xAl_yO_z$.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments are described herein with reference to a multi-component coating that includes multiple layers that have been deposited using atomic layer deposition (also referred to as atomic monolayer deposition or ALD). Each component may be a constituent material that is included in one or more layer of the coating. One example of a multi-component coating is a coating that includes a first component of yttrium and a second component of oxygen, such as yttria ($Y_2O_3$). In another example, a multi-component coating may include a first component of $Y_2O_3$ and a second component of $YF_3$. The first and second components may be arranged in different layers of the multi-component coating. In some embodiments, after processing such as annealing the multiple layers of the multi-component coating may interdiffuse to form a homogenous or approximately homogenous coating that includes the constituent materials of the different layers. For example, the multiple components from the different layers may form a solid state phase of a first film layer and a second film layer. In a further example, an alternating stack of $Y_2O_3$ layers and $YF_3$ layers may interdiffuse to form a solid state phase of a yttrium oxy-fluoride. The multi-component coating may be a coating having multiple different oxides, multiple different fluorides, or a combination of one or more oxides and one or more fluorides that have or have not interdiffused. Alternatively, or additionally, the multi-component coating may be a coating having a mixture of a metal and oxygen, a metal and fluorine, a metal and oxygen and fluorine, or multiple metals with one or more of oxygen and fluorine.

Figure 1:
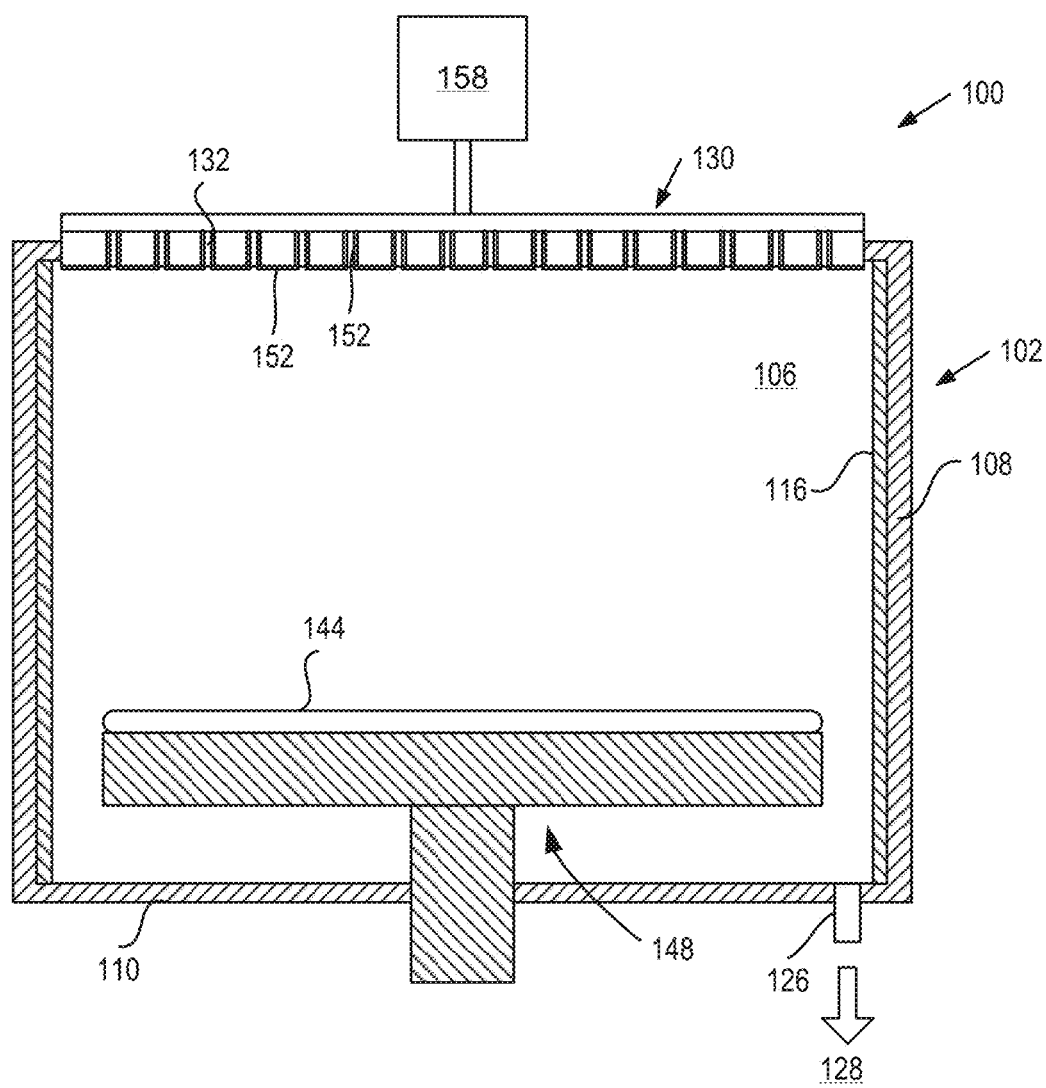
FIG. 1 depicts a sectional view of one embodiment of a processing chamber.

FIG. 1 is a sectional view of a semiconductor processing chamber 100 having one or more chamber components that are coated with a multi-component coating in accordance with embodiments of the present invention. The processing chamber 100 may be used for processes in which a corrosive plasma environment having plasma processing conditions is provided. For example, the processing chamber 100 may be a chamber for a plasma etcher or plasma etch reactor, a plasma cleaner, and so forth. Examples of chamber components that may include a multi-component coating include chamber components with complex shapes and holes having large aspect ratios. Some example chamber components include a substrate support assembly 148, an electrostatic chuck (ESC), a ring (e.g., a process kit ring or single ring), a chamber wall, a base, a gas distribution plate, a showerhead 130, gas lines, a nozzle, a lid, a liner, a liner kit, a shield, a plasma screen, a flow equalizer, a cooling base, a chamber viewport, a chamber lid, and so on. The multi-component coating, which is described in greater detail below, is applied using an ALD process. ALD, which is described in greater detail with reference to FIG. 2, allows for the application of a conformal coating of relatively uniform thickness on all types of components including components with complex shapes and holes with large aspect ratios.

The multi-component coating may be grown or deposited using ALD with various ceramics including oxide based ceramics, nitride based ceramics and carbide based ceramics. Examples of oxide based ceramics include $SiO_2$ (quartz), $Al_2O_3$, $Y_2O_3$, $Y_4Al_2O_9$, $Y_2O_3$—$ZrO_2$ and so on. Examples of carbide based ceramics include SiC, Si—SiC, and so on. Examples of nitride based ceramics include AlN, SiN, and so on.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the multi-component coating.

An outer liner 116 may be disposed adjacent the sidewalls 108 to protect the chamber body 102. The outer liner 116 may be fabricated and/or coated with a multi-component coating. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 and/or top of the chamber body 102. The showerhead 130 (or lid) may be opened to allow access to the interior volume 106 of the processing chamber 100 in some embodiments, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 is used for processing chambers used for dielectric etch (etching of dielectric materials). The showerhead 130 may include a gas distribution plate (GDP) having multiple gas delivery holes 132 throughout the GDP. The showerhead 130 may include the GDP bonded to an aluminum showerhead base or an anodized aluminum showerhead base. The GDP 133 may be made from Si or SiC, or may be a ceramic such as $Y_2O_3$, $Al_2O_3$, YAG, and so forth. Showerhead 130 and delivery holes 132 may be coated with a multi-component coating as described in more detail below with respect to FIGS. 4A and 4B. As illustrated, the showerhead 130 has a multi-component coating 152 both on a surface of the showerhead 130 (e.g., e.g., on a surface of a showerhead base and/or a surface of a GDP) and on walls of gas conduits (also referred to as holes) 132 in the showerhead (e.g., in the showerhead base and/or GDP), in accordance with one embodiment. However, it should be understood that any of the other chamber components, such as gas lines, electrostatic chucks, nozzles and others, may also be coated with a multi-component coating.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead 130 (e.g., including showerhead base, GDP and/or gas delivery conduits/holes) and/or nozzle may all be coated with a multi-component coating according to an embodiment.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The substrate support assembly 148 is disposed in the interior volume 106 of the processing chamber 100 below the showerhead 130 or lid. The substrate support assembly 148 holds the substrate 144 during processing and may include an electrostatic chuck bonded to a cooling plate.

An inner liner may be coated on the periphery of the substrate support assembly 148. The inner liner may be a halogen-containing gas resist material such as those discussed with reference to the outer liner 116. In one embodiment, the inner liner 118 may be fabricated from the same materials of the outer liner 116. Additionally, the inner liner 118 may also be coated with a multi-component coating.

Figure 2:
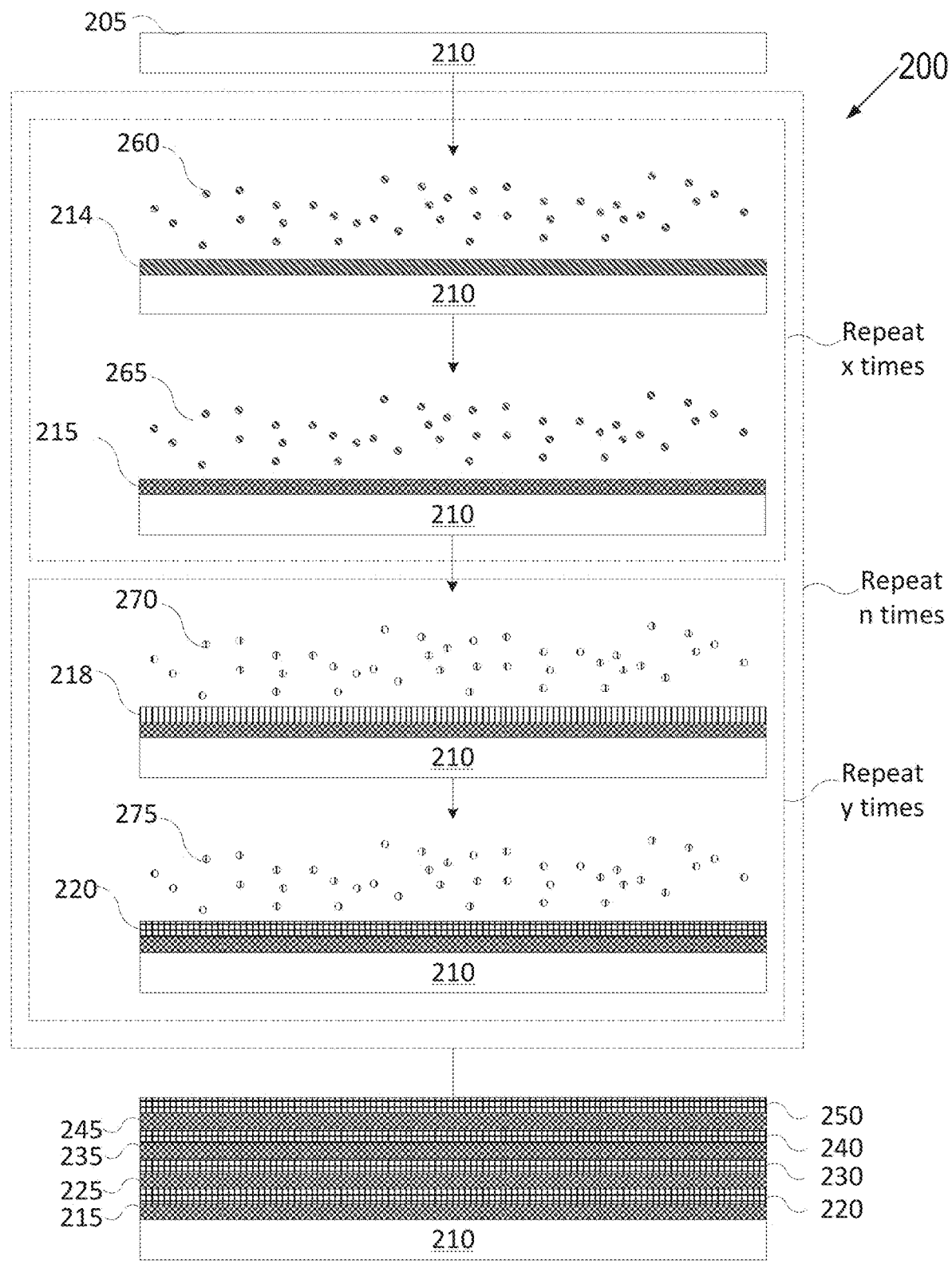
FIG. 2 depicts a deposition process in accordance with a variety of Atomic Layer Deposition techniques.

FIG. 2 depicts a deposition process in accordance with a variety of ALD techniques. Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to sequential alternating pulses of gaseous chemical precursors that chemically react with the surface one at a time in a self-limiting manner.

FIG. 2 illustrates an article 210 having a surface 205. Article 210 may represent various semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on. The article 210 and surface 205 may be made from a metal (such as aluminum, stainless steel), a ceramic, a metal-ceramic composite, a polymer, a polymer ceramic composite, or other suitable materials, and may further comprise materials such as AlN, Si, SiC, $Al_2O_3$, $SiO_2$, and so on.

Each individual chemical reaction between a precursor and the surface is known as a "half-reaction." During each half reaction, a precursor is pulsed onto the surface for a period of time sufficient to allow the precursor to fully react with the surface. The reaction is self-limiting as the precursor will only react with a finite number of available reactive sites on the surface, forming a uniform continuous adsorption layer on the surface. Any sites that have already reacted with a precursor will become unavailable for further reaction with the same precursor unless and/or until the reacted sites are subjected to a treatment that will form new reactive sites on the uniform continuous coating. Exemplary treatments may be plasma treatment, treatment by exposing the uniform continuous adsorption layer to radicals, or introduction of a different precursor able to react with the most recent uniform continuous film layer adsorbed to the surface.

In FIG. 2, article 210 having surface 205 may be introduced to a first precursor 260 for a first duration until a first half reaction of the first precursor 260 with surface 205 partially forms layer 215 by forming an adsorption layer 214. Subsequently, article 210 may be introduced to a second precursor 265 (also referred to as a reactant) to cause a second half reaction to react with the adsorption layer 214 and fully form the layer 215. The first precursor 260 may be a precursor for aluminum or another metal, for example. The second precursor 265 may be an oxygen precursor if the layer 215 is an oxide or a fluorine precursor if the layer 215 is a fluoride. Layer 215 may be uniform, continuous and conformal. The article 210 may alternately be exposed to the first precursor 260 and second precursor 265 up to x number of times to achieve a target thickness for the layer 215. X may be an integer from 1 to 100, for example.

Subsequently, article 210 having surface 205 and layer 215 may be introduced to a third precursor 270 that reacts with layer 215 to partially form a second layer 220 by forming a second adsorption layer 218. Subsequently, article 210 may be introduced to another precursor 275 (also referred to as a reactant) to cause a second half reaction to fully form the layer 220. The second film layer 220 may be uniform, continuous and conformal. The article 210 may alternately be exposed to the third precursor 270 and fourth precursor 275 up to y number of times to achieve a target thickness for the layer 220. Y may be an integer from 1 to 100, for example.

Thereafter, the sequence of introducing the article 210 to precursors 260 and 265 x number of times and then to precursors 270 and 275 y number of times may be repeated and performed n number of times. N may be an integer from 1 to 100, for example. A result of the sequence may be to grow additional alternating layers 225, 230, 235, 240, 245, and 250. The number and thickness of the layers may be selected based on the targeted coating thickness and properties. The various layers may remain intact or in some embodiments may be interdiffused.

The surface reactions (e.g., half-reactions) are done sequentially. Prior to introduction of a new precursor, the chamber in which the ALD process takes place may be purged with an inert carrier gas (such as nitrogen or air) to remove any unreacted precursor and/or surface-precursor reaction byproducts. At least two precursors are used. In some embodiments, more than two precursors may be used to grow film layers having the same composition (e.g., to grow multiple layers of $Y_2O_3$ on top of each other). In other embodiments, different precursors may be used to grow different film layers having different compositions.

ALD processes may be conducted at various temperatures depending on the type of ALD process. The optimal temperature range for a particular ALD process is referred to as the "ALD temperature window." Temperatures below the ALD temperature window may result in poor growth rates and non-ALD type deposition. Temperatures above the ALD temperature window may result in thermal decomposition of the article or rapid desorption of the precursor. The ALD temperature window may range from about 20° C. to about 400° C. In some embodiments, the ALD temperature window is between about 150-350° C.

The ALD process allows for conformal film layers having uniform film thickness on articles and surfaces having complex geometric shapes, holes with large aspect ratios, and three-dimensional structures. Sufficient exposure time of the precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets).

With the ALD technique, multi-component films such as $YO_xF_y$, $YAl_xO_y$, $YZr_xO_y$, and $YZr_xAl_yO_z$ can be grown, for example, by proper sequencing of the precursors used to grow $Y_2O_3$, $Al_2O_3$, $YF_3$, and $ZrO_2$, as illustrated in more detail in the examples below.

Figure 3A:
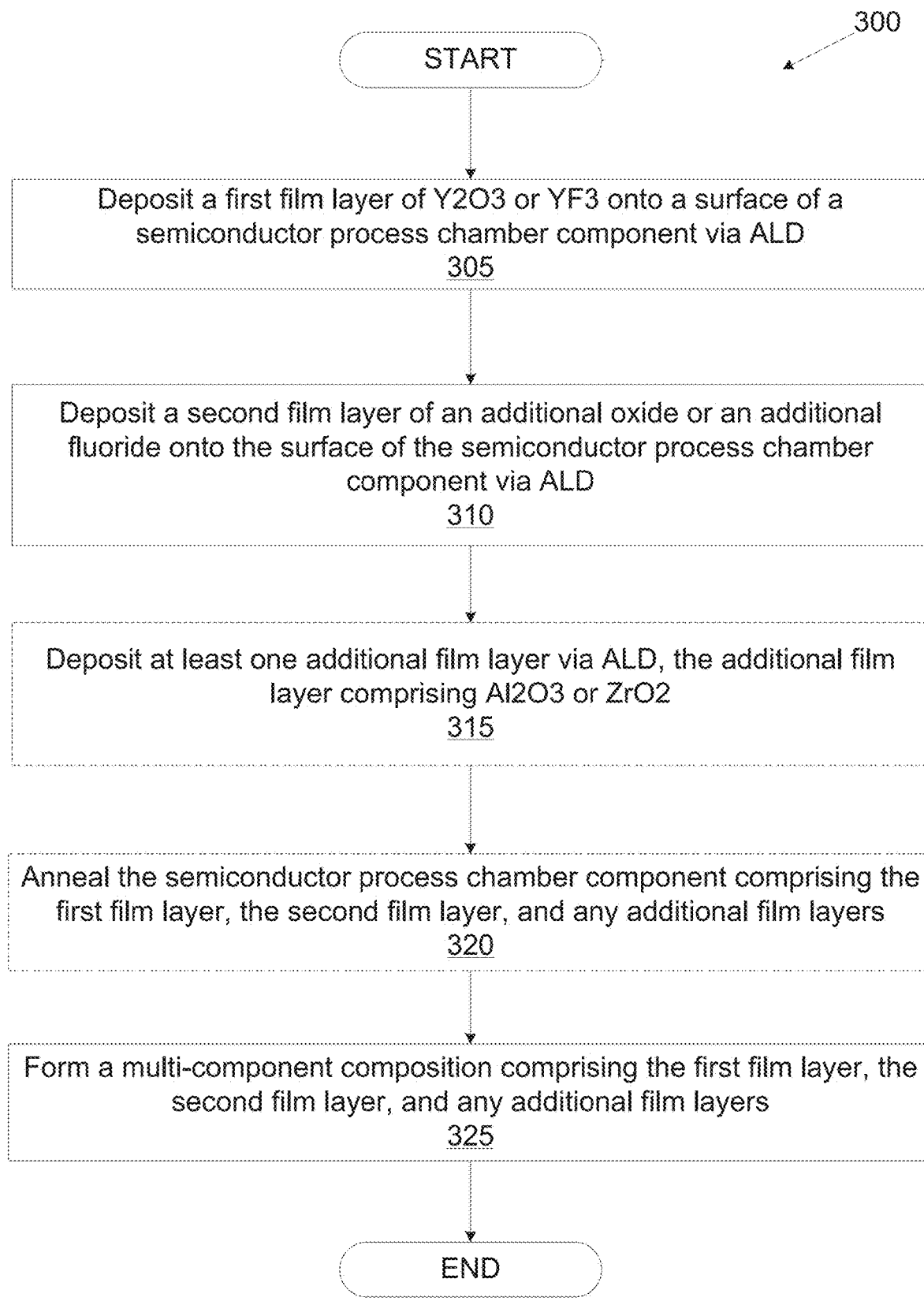
FIG. 3A illustrates a method for forming a multi-component coating on a semiconductor process chamber component according to an embodiment.

FIG. 3A illustrates a method 300 for forming a multi-component coating on a semiconductor process chamber component according to an embodiment. The method may optionally begin by selecting a composition for the multi-component coating. The composition selection and method of forming may be performed by the same entity or by multiple entities. Pursuant to block 305, the method comprises depositing a first film layer of a yttrium oxide or a yttrium fluoride onto a surface of a semiconductor process chamber component, wherein the first film layer is grown from at least two precursors using an ALD process. Pursuant to block 310, the method further comprises depositing a second film layer of an additional oxide or an additional fluoride onto the surface of the semiconductor process chamber component, wherein the second film layer is grown from at least two additional precursors using the ALD process. Note that the first film may be deposited before or after the second film is deposited. Accordingly, the first film may be deposited over the second film or the second film may be deposited over the first film. In some embodiments, pursuant to block 315, the method may optionally further comprise depositing at least one additional film layer, the at least one additional film layer comprising aluminum oxide or zirconium oxide, wherein the at least one additional film layer is grown from additional precursors using the ALD process.

In some embodiments, when the first film layer comprises yttrium oxide, the layer may be formed by the following process sequence:
1) Reaction of a precursor with the substrate surface. The precursor may include tris(N,N-bis(trimethylsilyl)amide)yttrium(III), tris(cyclopentadienyl)yttrium(III), tris(butylcyclopentadienyl)yttrium(III), or tris(2,2,6,6-tetramethyl-3,5-heptanedionato)yttrium(III).
2) Purging of non-reacted precursor from the ALD process chamber.
3) Reaction of a second precursor with the surface. The second precursor may include $H_2O$, $O_2$, or $O_3$.
4) Purging of the second non-reacted precursor from the ALD process chamber.
In some embodiments, when the first film layer comprises yttrium fluoride, the two precursors used may be tris(2,2,6,6-tetramethyl-3,5-heptanedionato)yttrium(III) and $TiF_4$.

In some embodiments, when the second film layer comprises aluminum oxide, one precursor may include diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum. The second precursor may include $H_2O$, $O_2$, or $O_3$. In some embodiments, when the second film layer comprises zirconium oxide, one precursor may include zirconium (IV) bromide, zirconium (IV) chloride, zirconium (IV) tert-butoxide, tetrakis(diethylamido)zirconium (IV), tetrakis(dimethylamido) zirconium (IV), or tetrakis(ethylmethylamido)zirconium (IV). The second precursor may include $H_2O$, $O_2$, or $O_3$.

The precursors listed above or any other suitable precursors may be used each time a yttrium oxide layer, a yttrium fluoride layer, an aluminum oxide layer, or a zirconium oxide layer is grown using ALD, regardless of whether it is the first, second, or Nth layer, where the Nth layer would represent the finite number of layers grown on the surface of the semiconductor process chamber component and selected based on targeted protective coating thickness and properties.

Pursuant to block 325, the method ultimately comprises forming a multi-component composition of the first film layer, the second film layer, and any additional film layers. In some embodiments, pursuant to block 320, forming the multi-component composition comprises annealing the semiconductor process chamber component comprising the first film layer, the second film layer, and any additional film layers deposited onto the semiconductor process chamber component. In some embodiments, the annealing may result in a multi-component composition comprising an interdiffused solid state phase of the at least one first film layer and the at least one second film layer and any of at least one additional film layers (if present). Annealing may be performed at a temperature ranging from about 800° C. to about 1800° C., from about 800° C. to about 1500° C., or from about 800° C. to about 1000° C. The annealing temperature may be selected based on the material of construction of the article, surface, and film layers so as to maintain their integrity and refrain from deforming, decomposing, or melting any or all of these components.

Figure 3B:
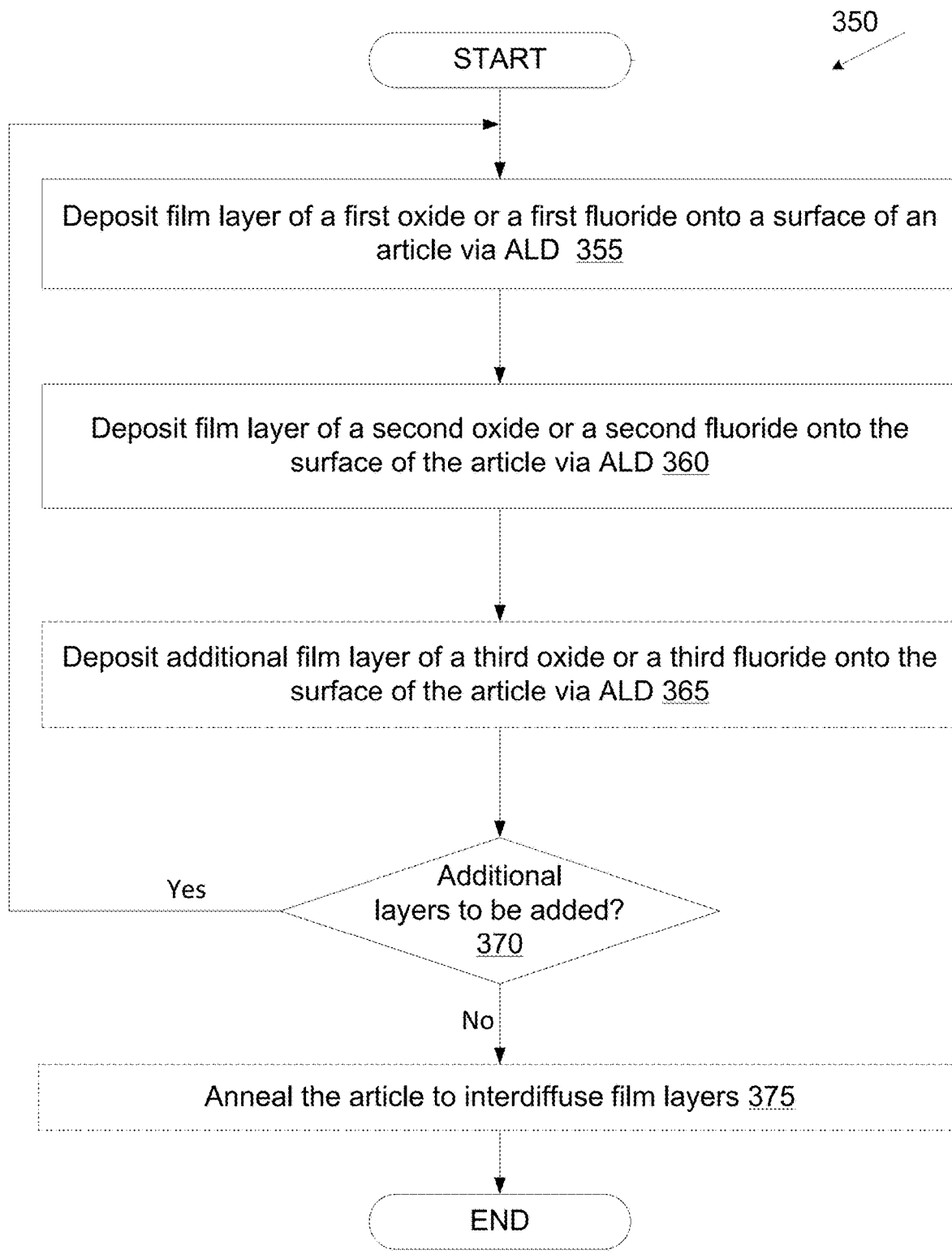
FIG. 3B illustrates a method for forming a multi-component coating on a semiconductor process chamber component according to an embodiment.

FIG. 3B illustrates a method 350 for forming a multi-component coating on a semiconductor process chamber component according to an embodiment. The method may optionally begin by selecting a composition for the multi-component coating. The composition selection and method of forming may be performed by the same entity or by multiple entities.

Pursuant to block 355, the method comprises depositing a film layer of a first oxide or a first fluoride onto a surface of an article via ALD. Pursuant to block 360, the method further comprises depositing a film layer of a second oxide or a second fluoride onto the surface of the article via ALD. Note that the film layer of the first oxide or first fluoride may be deposited before or after the film layer of the second oxide or the second fluoride is deposited. Accordingly, the film layer of the first oxide or first fluoride may be deposited over the film layer of the second oxide or the second fluoride in some embodiments. In other embodiments, the film layer of the second oxide or second fluoride may be deposited over the film layer of the first oxide or the first fluoride. In some embodiments, pursuant to block 365, the method may optionally further comprise depositing an additional film layer of a third oxide or a third fluoride onto the surface of the article via ALD.

In some embodiments, pursuant to block 370, the method may further comprise determining whether additional layers are to be added. Determining whether additional layers and/or how many layers are to be added can be either done in-situ, or prior to initiating the depositions (e.g., in the optional multi-component composition selection process). If additional layers are to be added, blocks 355, 360, and optionally 365 may be repeated. If no additional layers are to be added, the method proceeds to form a multi-component composition comprising all film layers deposited onto the surface of the article.

In some embodiments, when the first oxide, second oxide, or third oxide of any of the film layers comprises yttrium oxide, one precursor used to form yttrium oxide by ALD may be selected from tris(N,N-bis(trimethylsilyl)amide)yttrium(III), tris(cyclopentadienyl)yttrium(III), tris(butylcyclopentadienyl)yttrium(III), or tris(2,2,6,6-tetramethyl-3,5-heptanedionato)yttrium(III), and the second precursor may be selected from H2O, O2, or O3. In some embodiments, when the first fluoride, second fluoride, or third fluoride of any of the film layers comprises yttrium fluoride, the two precursors used to form this film may be tris(2,2,6,6-tetramethyl-3,5-heptanedionato)yttrium(III) and $TiF_4$.

In some embodiments, when the first oxide, second oxide, or third oxide of any of the film layers comprises aluminum oxide, one precursor used to form aluminum oxide by ALD may be selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum, and the second precursor may be selected from $H_2O$, $O_2$, or $O_3$. In some embodiments, when the first oxide, second oxide, or third oxide of any of the film layers comprises zirconium oxide, one zirconium oxide precursor may be selected from zirconium (IV) bromide, zirconium (IV) chloride, zirconium (IV) tert-butoxide, tetrakis(diethylamido)zirconium (IV), tetrakis(dimethylamido)zirconium (IV), or tetrakis(ethylmethylamido)zirconium (IV), and the second precursor may be selected from $H_2O$, $O_2$, or $O_3$.

The listed precursors or any other suitable precursors may be used each time a yttrium oxide layer, a yttrium fluoride layer, an aluminum oxide layer, or a zirconium oxide layer is grown using ALD, regardless of whether it is the first, second, or Nth film layer, where the Nth film layer would represent a finite number of film layers grown on the surface of the article and selected based on targeted protective coating thickness and properties.

In some embodiments, the method may proceed to optional block 375 where the multi-component composition of all film layers deposited onto the surface of the article may be annealed. In some embodiments, the annealing may result in a multi-component composition comprising an interdiffused solid state phase of all film layers deposited onto the surface of the article. Annealing may be performed at a temperature ranging from about 800° C. to about 1800° C., from about 800° C. to about 1500° C., or from about 800° C. to about 1000° C. The annealing temperature may be selected based on the material of construction of the article, surface, and film layers so as to maintain their integrity and refrain from deforming, decomposing, or melting any or all of these components.

Figure 4A:
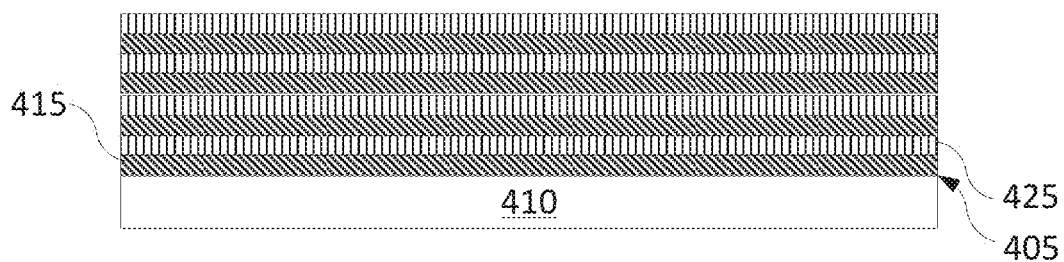
FIGS. 4A-4D depict variations of a multi-component coating composition according to different embodiments.

FIGS. 4A-4D depict variations of a multi-component coating composition according to different embodiments. FIG. 4A illustrates a multi-component coating composition for a surface 405 of an article 410 according to an embodiment. Surface 405 may be the surface of various articles 410. For example, articles 410 may include carious semiconductor process chamber components including but not limited to substrate support assembly, an electrostatic chuck (ESC), a ring (e.g., a process kit ring or single ring), a chamber wall, a base, a gas distribution plate, gas lines, a showerhead, a nozzle, a lid, a liner, a liner kit, a shield, a plasma screen, a flow equalizer, a cooling base, a chamber viewport, a chamber lid, and so on. The semiconductor process chamber component may be made from a metal (such as aluminum, stainless steel), a ceramic, a metal-ceramic composite, a polymer, a polymer ceramic composite, or other suitable materials, and may further comprise materials such as AlN, Si, SiC, $Al_2O_3$, $SiO_2$, and so on.

In FIG. 4A, the multi component coating composition comprises: at least one first film layer 415 of a yttrium oxide or a yttrium fluoride coated onto surface 405 of article 410 using an ALD process and at least one second film layer 425 of an additional oxide or an additional fluoride coated onto surface 405 of article 410 using an ALD process.

FIG. 4A illustrates an embodiment where the multi-component coating composition comprises a stack of alternating layers of the first layer 415 and the second layer 425, where the layers are intact and not interdiffused, where there is an equal number of each of the layers (four 415 layers and four 425 layers), and where all layers are of equal uniform thickness. In some embodiments, the first film layer is deposited prior to the deposition of the second film layer, and the second film layer is deposited over the first film layer. In some embodiments, the order may be reversed.

Figure 4B:
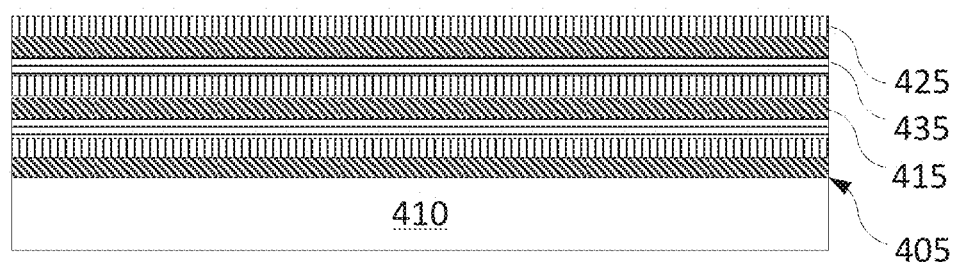

FIG. 4B illustrates an embodiment where the multi-component coating composition, deposited on surface 405 of article 410 (e.g., a semiconductor process chamber component as described above), comprises a stack of alternating layers of the first layer 415, second layer 425, and at least one additional layer 435, where the layers are intact and deposited and/or grown at a predetermined order and with a uniform equal thickness. However, the number of layers may not be equal and certain layers may be more prevalent than others (e.g., three 415 layers, three 425 layers, two 435 layers).

In some embodiments, the at least one first film layer comprises a first continuous monolayer, and the at least one second film layer comprises a second continuous monolayer. In some embodiments, at least one additional layer may comprise at least one additional monolayer.

In other embodiments, the at least one first film layer comprises a first thick layer having a uniform thickness, the uniform thickness ranging from that of two monolayers to about 1 micrometer, and wherein the at least one second film layer comprises a second thick layer having the uniform thickness of the first film layer. In yet other embodiments, at least one additional film layer may comprise at least one additional thick layer having the uniform thickness of the other two thick layers.

In some embodiments, the multi-component coating composition may comprise at least one first film layer, at least one second film layer, and optionally one or more additional film layers, wherein the layers may vary in thickness. For example, some layers may be monolayers and some layers may be thick layers.

Figure 4C:
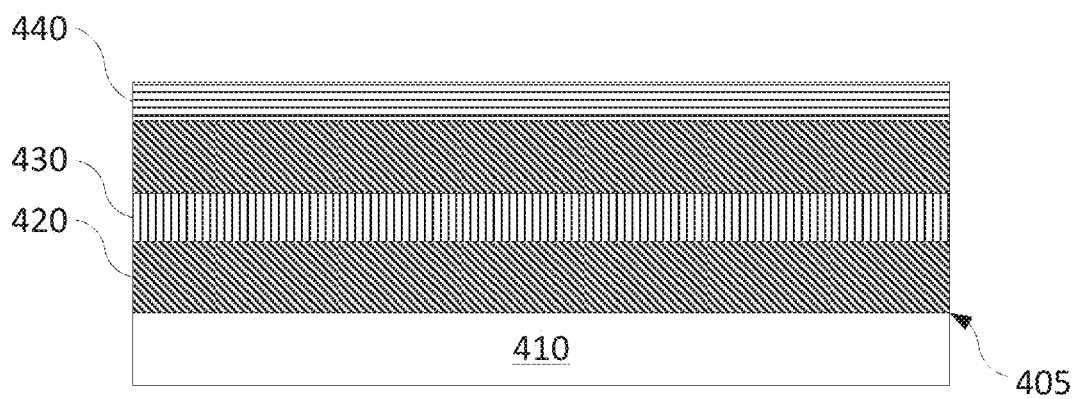

FIG. 4C illustrates an embodiment where the multi-component coating, deposited on surface 405 of article 410, comprises a stack of intact uniform film layers without a fixed order or fixed thickness. The multi-component coating comprises a first thick layer 420 having a first thickness, a second thick layer 430 having a second thickness different from the first thickness, and at least one additional thick layer 440 having a third thickness different from the first and the second thickness. Certain layers may be more prevalent than others so as to achieve certain properties (such as erosion/corrosion resistance) for the multi-component coating (e.g., two of the first thick layers 420, one second thick layer 430, one and one additional thick layer 440 layer).

In some embodiments, the various film layers illustrated in FIGS. 4A through 4C may have the same composition. In other embodiments, the compositions of the layers may be different. In some embodiments, the various film layers may have similar properties such as thickness, porosity, plasma resistance, CTE. In other embodiments, each film layer may have different properties. It is to be understood that although FIGS. 4A-4C depict a certain number of film layers, the Figures are not intended to be limiting, and more or less film layers may be deposited onto the surface in certain embodiments. In some embodiments, the entire surface of semiconductor process chamber component may be coated. In other embodiments, at least a portion of the semiconductor process chamber components' surface may be coated.

Figure 4D:
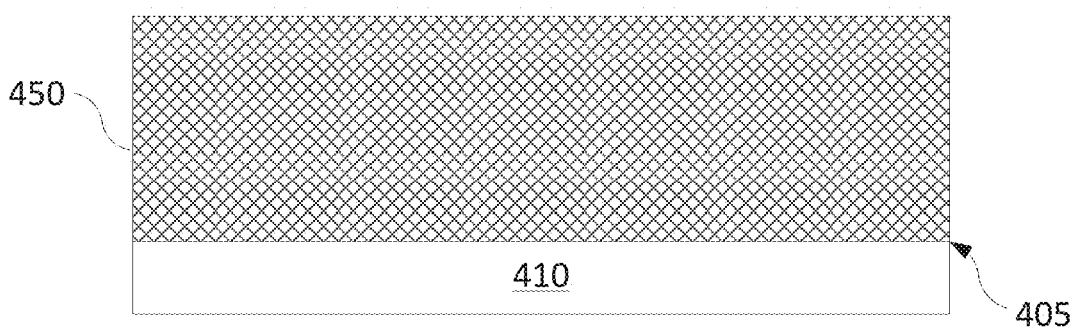

FIG. 4D illustrates an embodiment where the multi-component coating composition 450, deposited on surface 405 of article 410, comprises an interdiffused solid state phase of the at least one first film layer, the at least one second film layer, and optionally the at least one additional film layer.

In some embodiments, the multi-component coating composition, whether comprising intact layers or an interdiffused solid state phase, is selected from the group consisting of $YO_xF_y$, $YAl_xO_y$, $YZr_xO_y$, and $YZr_xAl_yO_z$. The processes for creating these various multi-component coating compositions are illustrated in the examples below.

Figure 5A:
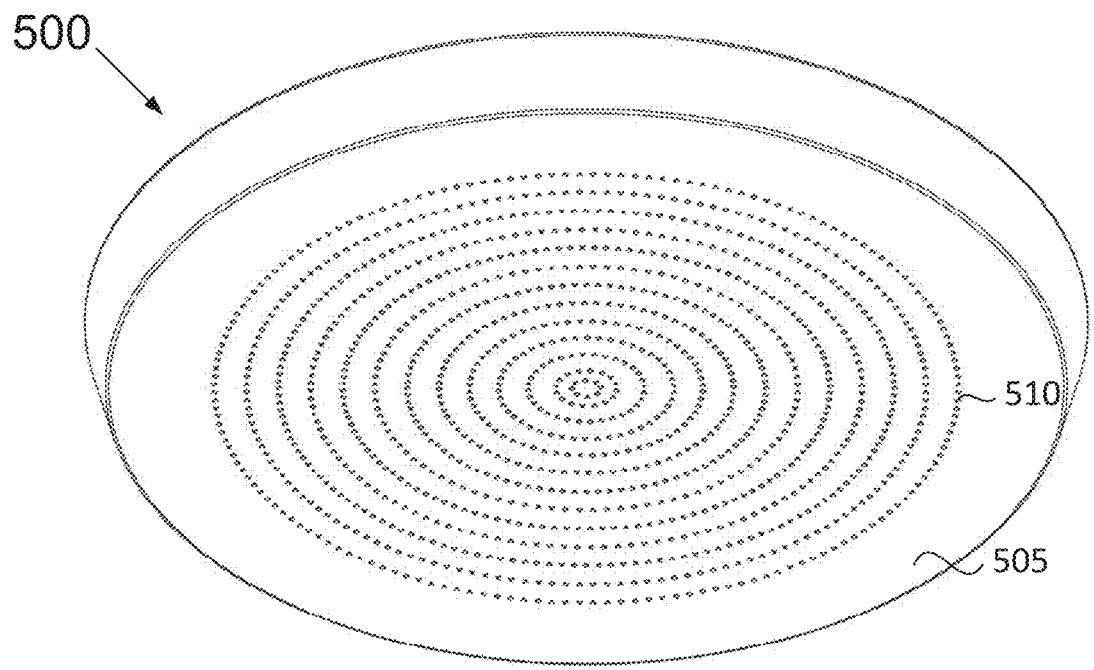
FIG. 5A depicts a coated chamber component (showerhead) according to an embodiment.

FIG. 5A illustrates a bottom view of a showerhead 500. The showerhead example provided below is just an exemplary chamber component whose performance may be improved by the use of the multi-component coating as set forth in embodiments herein. It is to be understood that the performance of other chamber components may also be improved when coated with the multi-component coating disclosed herein. The showerhead 500, as depicted here, was chosen as an illustration of a semiconductor process chamber component having a surface with complex geometry and holes with large aspect ratios.

The complex geometry of lower surface 505 is configured to receive a multi-component coating. Lower surface 505 of showerhead 500 defines gas conduits 510 arranged in evenly distributed concentric rings. In other embodiments, gas conduits 510 may be configured in alternative geometric configurations and may have as many or as few gas conduits as needed depending on the type of reactor and/or process utilized. The multi-component coating is grown on surface 505 and in gas conduit holes 510 using the ALD technique which enables a conformal coating of relatively uniform thickness on the surface as well as in the gas conduit holes despite the complex geometry and the large aspect ratios of the holes.

Showerhead 500 may be exposed to corrosive chemistries such fluorine and may erode due to plasma interaction with the showerhead. The multi-component coating layer may reduce such plasma interactions and improve the showerhead's durability. The multi-component coating layer deposited with ALD maintains the relative shape and geometric configuration of the lower surface 505 and of the gas conduits 510 so as to not disturb the functionality of the showerhead. Similarly, when applied to other chamber components, the multi-component coating may maintain the shape and geometric configuration of the surface it is intended to coat so as to not disturb the component's functionality, provide plasma resistance, and improves erosion and/or corrosion resistance throughout the entire surface.

The resistance of the coating material to plasma is measured through "etch rate" (ER), which may have units of Angstrom/min (Å/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr is typical for a multi-component plasma resistant coating material. Variations in the composition of the multi-component coating grown on the showerhead or on any other semiconductor process chamber component may result in multiple different plasma resistances or erosion rate values. Additionally, a multi-component coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma.

Figure 5B:
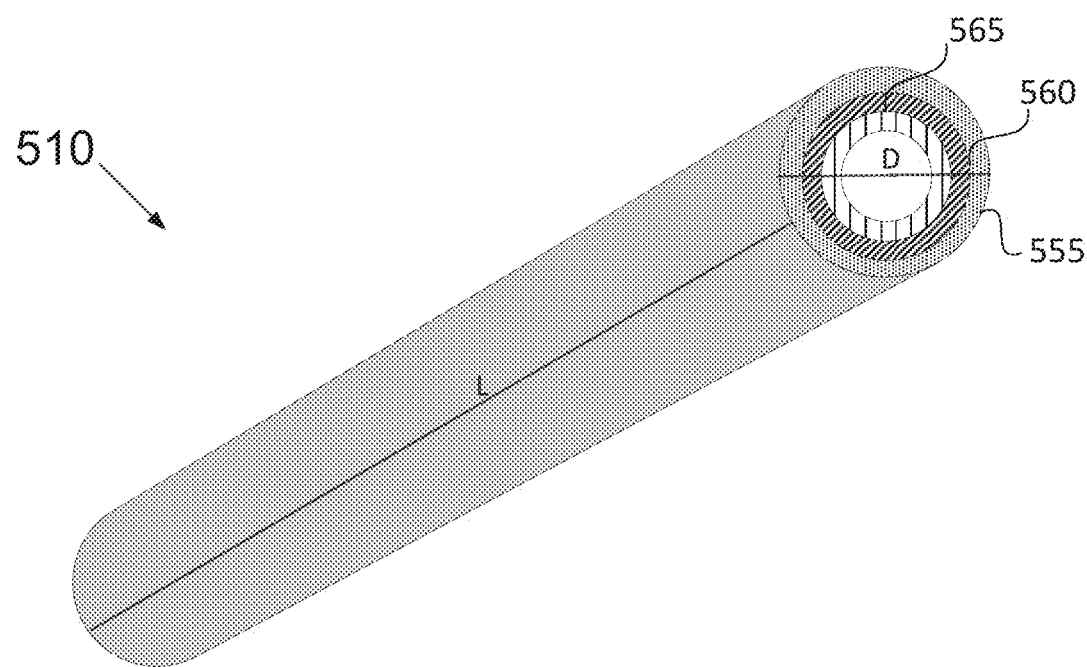
FIG. 5B depicts a blown up view of a gas conduit having a large aspect ratio coated according to an embodiment.

FIG. 5B depicts a blown up view of a gas conduit 510 having a large aspect ratio coated according to an embodiment. Gas conduit 510 may have a length L and a diameter D. Gas conduit 510 may have a large aspect ratio defined as L:D, wherein the aspect ratio may range from about 50:1 to about 100:1. In some embodiments, the aspect ratio may be lower than 50:1 or greater than 100:1.

Gas conduit 510 may have an interior surface 555 which may be coated with a multi-component coating. The multi-component coating may comprise at least one first layer 560 and at least one second layer 565 and optionally at least one additional layer (not shown). The first film layer may comprise yttrium oxide or yttrium fluoride. The second film layer may comprise an additional oxide or an additional fluoride. The optional at least one additional layer may comprise aluminum oxide or zirconium oxide. All layers may be coated using an ALD process. The ALD process may grow conformal coating layers of uniform thickness throughout the interior surface of gas conduit 510 despite its large aspect ratio while ensuring that the final multi-component coating may also be thin enough so as to not plug the gas conduits in the showerhead.

In some embodiments, the multi-component coating may comprise intact layers of at least one first layer, at least one second layer, and optionally at least one additional layer. In an embodiment, the first, second, and any optional additional layers may alternate at a predetermined order. In another embodiment, the first, second, and any optional additional layers may be present in any order. In some embodiments, there may be an equal number of each one of the first, of the second, and of any optional additional layer. In other embodiments, some of the layers may be more prevalent than other layers so as to achieve certain properties for the multi-component coating. Certain properties may be plasma resistance and erosion/corrosion resistance that would improve the durability of the coated semiconductor process chamber component.

In some embodiments, the intact layers may comprise monolayers of uniform thickness. In other embodiments, the intact layers may comprise thicker layers of uniform thickness. Each thicker layer may have a thickness ranging from that of two monolayers to about 1 micrometer. In yet other embodiments, the intact layers may comprise a combination of monolayers and thick layers.

In other embodiments, the multi-component coating may comprise interdiffused solid state phase of at least one first layer, at least one second layer, and optionally at least one additional layer. In an embodiment, an interdiffused solid state phase of the various layers may be obtained through annealing. The composition of the layers, number of layers, frequency of each layer, and thickness of the layers will all contribute to the final properties of the multi-component coating layer.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing method 300 or method 350 described above.

Example 1—Forming a $YO_xF_y$ Coating from Yttrium Oxide and Yttrium Fluoride Monolayers The first layer may be a yttrium oxide monolayer grown using ALD from a precursor selected from tris(N,N-bis(trimethylsilyl)amide)yttrium (III) tris(cyclopentadienyl)yttrium(III), tris(butylcyclopentadienyl)yttrium(III), or tris(2,2,6,6-tetramethyl-3,5-heptanedionato)yttrium(III), and a second precursor selected from $H_2O$, $O_2$ or $O_3$. The second layer may be yttrium fluoride monolayer grown using ALD from a single combination of the precursors tris(2,2,6,6-tetramethyl-3,5-heptanedionato)yttrium(III) and $TiF_4$. The resulting multi-component coating may comprise $YO_xF_y$, where X and Y depend on the number of repetitions of the first and the second layer.

Example 2—Forming a $YAl_xO_y$ Coating from Yttrium Oxide and Aluminum Oxide Monolayers The first layer may be a yttrium oxide monolayer grown using ALD from a precursor selected from tris(N,N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and a second precursor selected from $H_2O$, $O_2$, or $O_3$. The second layer may be aluminum oxide monolayer grown using ALD from a precursor selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum, and a second precursor selected from $H_2O$, $O_2$, or $O_3$. The resulting multi component coating may comprise $YAl_xO_y$ where X and Y depend on the number of repetitions of the first and the second layer.

In some experiments stacks of alternating layers of $Y_2O_3$ and $Al_2O_3$ were deposited via ALD, where each may layer had a thickness of 5 nm. Other thicknesses may also be used for the individual layers, such as anywhere from a few Angstroms to about 10 nm or thicker. A total coating thickness in the experiments was about 200 nm. Samples were annealed at temperatures of 500° C., 750° C., 800° C., 900° C. and or 1000° C. for 12 hrs. The annealed and as-coated samples were analyzed by grazing incidence x-ray diffraction to determine a microstructure of the coating for each of the samples. Testing showed that the coating transformed from an amorphous structure to a mostly crystalline structure consisting primarily of the cubic $Y_3Al_5O_{12}$ or $Y_3Al_5O_{13}$ (i.e., yttrium aluminum garnet) phase as a result of annealing at temperatures of 800° C. and above. At temperatures of 500° C. and 750° C., crystallization of $Y_2O_3$ occurred but the yttrium aluminum garnet phase did not form. For example, after annealing at 500° C. an amorphous phase and a crystalline $Y_2O_3$ phase were formed. The amorphous phase may contain some $Y_2O_3$ that has not crystallized. Table 1 below shows the phase identification of a stack of alternating layer films of $Al_2O_3/Y_2O_3$, as-deposited and annealed at various temperatures.

TABLE 1

Phase Identification of $Al_2O_3/Y_2O_3$ Alternating Layer Films, As-Deposited and Annealed at Various Temperatures

| Annealing Temperature | Phase Identified |
| --- | --- |
| No annealing | Amorphous |
| 500° C. | Amorphous |
| | $Y_2O_3$ - Cubic, SG: Fm-3m (225) |
| 750° C. | Amorphous |
| | $Y_2O_3$ - Cubic, SG: Fm-3m (225) |
| 800° C. | $Y_3Al_5O_{13}$ - Cubic, SG: Ia-3d (230) |
| | Minor/trace phase: |
| | $YAlO_3$ - Hexagonal, SG: P63/mmc (194) |
| 900° C. | $Y_3Al_5O_{13}$ - Cubic, SG: Ia-3d (230) |
| | Minor/Trace Phases: |
| | $Y_2O_3$ - Cubic, SG: ia-3 (206) |
| | $Al_{2.66}O_4$ (Aluminum Oxide (gamma)) - Cubic, SG: Fd-3m (227) |

TABLE 1-continued

Phase Identification of $Al_2O_3/Y_2O_3$ Alternating Layer Films, As-Deposited and Annealed at Various Temperatures

| Annealing Temperature | Phase Identified |
| --- | --- |
| 1000° C. | $Y_3Al_5O_{12}$ - Cubic, SG: Ia-3d (230) |
| | Minor/Trace Phases: |
| | $Y_4Si_4O_{14}$ - Triclinic, SG: P-1 (2) |
| | Amorphous |

Figure 6:
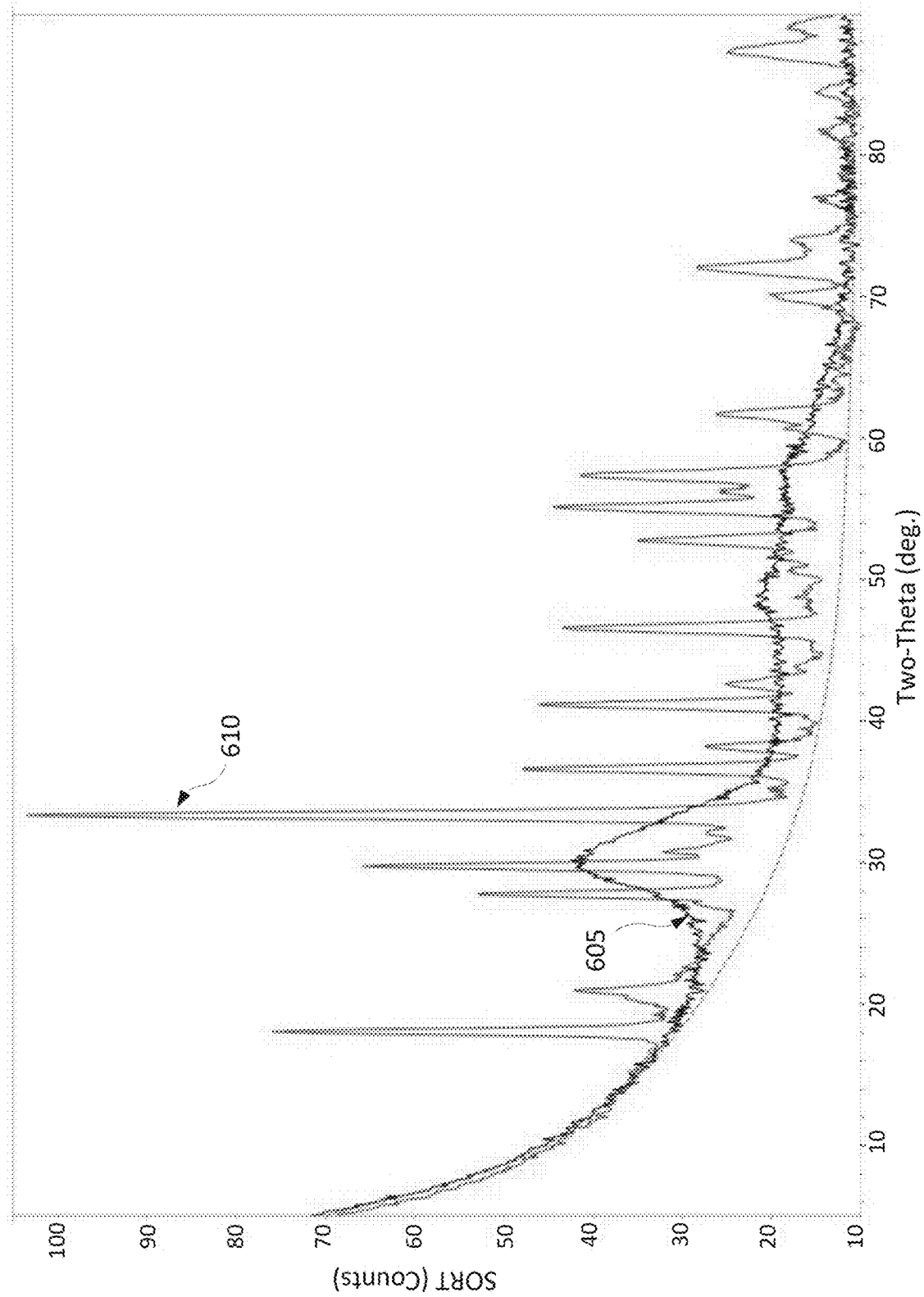
FIG. 6 is a graph showing x-ray diffraction patterns of a stack of alternating layers of $Al_2O_3$ and $Y_2O_3$ as coated and after annealing.

FIG. 6 is a graph showing x-ray diffraction patterns of a stack of alternating layers of $Al_2O_3$ and $Y_2O_3$ as coated 605 and after annealing 610 at a temperature of 1000° C. for 12 hours. As shown, the stack of alternating layers diffused into each other and formed a $Y_3Al_5O_{12}$ after annealing.

Example 3—Forming a $YZr_xO_y$ Coating from Yttrium Oxide and Zirconium Oxide Monolayers The first layer may be a yttrium oxide monolayer grown using ALD from a precursor selected from tris(N,N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and a second precursor selected from $H_2O$, $O_2$, or $O_3$. The second layer may be zirconium oxide monolayer grown using ALD from a precursor selected from zirconium (IV) bromide, zirconium (IV) chloride, zirconium (IV) tert-butoxide, tetrakis(diethylamido)zirconium (IV), tetrakis(dimethylamido) zirconium (IV), or tetrakis(ethylmethylamido)zirconium (IV), and a second precursor selected from $H_2O$, $O_2$, or $O_3$. The resulting multi component coating may comprise $YZr_xO_y$ where X and Y depend on the number of repetitions of the first and the second layer.

Example 4—Forming a $YZr_xAl_yO_z$ Coating from Yttrium Oxide, Zirconium Oxide, and Aluminum Oxide Monolayers The first layer may be a yttrium oxide monolayer grown using ALD from a precursor selected from tris(N,N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and a second precursor selected from $H_2O$, $O_2$, or $O_3$. The second layer may be zirconium oxide monolayer grown using ALD from a precursor selected from zirconium (IV) bromide, zirconium (IV) chloride, zirconium (IV) tert-butoxide, tetrakis(diethylamido)zirconium (IV), tetrakis(dimethylamido) zirconium (IV), or tetrakis(ethylmethylamido)zirconium (IV), and a second precursor selected from $H_2O$, $O_2$, or $O_3$. The at least one additional layer may be aluminum oxide monolayer grown using ALD from a precursor selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum, and a second precursor selected from $H_2O$, $O_2$, or $O_3$. The resulting multi component coating may comprise $YZr_xAl_yO_z$ where X, Y, and Z depend on the number of repetitions of the first, second, and at least one additional layer.

Example 5—Forming a $YO_xF_y$ Coating from Yttrium Oxide and Yttrium Fluoride Thick Layers The first layer may be a yttrium oxide thick layer grown using ALD from at least one precursor selected from tris(N, N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and at least one precursor selected from $H_2O$, $O_2$, or $O_3$. The second layer may be yttrium fluoride thick layer grown using ALD from the precursors tris(2,2,6,6-tetramethyl-3,5-heptanedionato)yttrium(III) and $TiF_4$. The resulting multi component coating may comprise $YO_xF_y$ where X and Y depend on the number of repetitions of the first and the second layer.

Example 6—Forming a $YAl_xO_y$ Coating from Yttrium Oxide and Aluminum Oxide Thick Layers The first layer may be a yttrium oxide thick layer grown using ALD from at least one precursor selected from tris(N, N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and at least one precursor selected from $H_2O$, $O_2$, or $O_3$. The second layer may be aluminum oxide thick layer grown using ALD from at least one precursor selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum, and at least one precursor selected from $H_2O$, $O_2$, or $O_3$. The resulting multi component coating may comprise $YAl_xO_y$ where X and Y depend on the number of repetitions of the first and the second layer.

Example 7—Forming a $YZr_xO_y$ Coating from Yttrium Oxide and Zirconium Oxide Thick Layers The first layer may be a yttrium oxide thick layer grown using ALD from at least one precursor selected from tris(N, N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and at least one precursor selected from $H_2O$, $O_2$, or $O_3$. The second layer may be zirconium oxide thick layer grown using ALD from at least one precursor selected from zirconium (IV) bromide, zirconium (IV) chloride, zirconium (IV) tert-butoxide, tetrakis(diethylamido)zirconium (IV), tetrakis(dimethylamido)zirconium (IV), or tetrakis(ethylmethylamido)zirconium (IV), and at least one precursor selected from $H_2O$, $O_2$, or $O_3$. The resulting multi component coating may comprise $YZr_xO_y$ where X and Y depend on the number of repetitions of the first and the second layer.

Example 8—Forming a $YZr_xAl_yO_z$ Coating from Yttrium Oxide, Zirconium Oxide, and Aluminum Oxide Thick Layers The first layer may be a yttrium oxide thick layer grown using ALD from at least one precursor selected from tris(N, N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and at least one precursor selected from $H_2O$, $O_2$, or $O_3$. The second layer may be zirconium oxide thick layer grown using ALD from at least one precursor selected from zirconium (IV) bromide, zirconium (IV) chloride, zirconium (IV) tert-butoxide, tetrakis(diethylamido)zirconium (IV), tetrakis(dimethylamido)zirconium (IV), or tetrakis(ethylmethylamido)zirconium (IV), and at least one precursor selected from $H_2O$, $O_2$, or $O_3$. The at least one additional layer may be aluminum oxide thick layer grown using ALD from at least one precursor selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum, and at least one precursor selected from $H_2O$, $O_2$, or $O_3$. The resulting multi component coating may comprise $YZr_xAl_yO_z$ where X, Y, and Z depend on the number of repetitions of the first, second, and at least one additional layer.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   performing a plurality of iterations of a super-cycle of an atomic layer deposition process to deposit a film having a multi-component composition onto a bare surface of an uncoated chamber component, wherein performing an iteration of the super-cycle of the atomic layer deposition process comprises:
   depositing a first film layer of yttrium oxide or yttrium fluoride, wherein the first film layer is grown from a first set of at least two precursors using the atomic layer deposition process, and wherein the first film layer has a first uniform thickness of two monolayers to about 10 nanometers;
   depositing a second film layer of zirconium oxide or zirconium fluoride, wherein the second film layer is grown from a second set of at least two precursors using the atomic layer deposition process, wherein the second film layer has a second uniform thickness of two monolayers to about 10 nanometers; and depositing a third film layer, the third film layer comprising aluminum oxide or aluminum fluoride, wherein the third film layer is grown from a third set of at least two precursors using the atomic layer deposition process, wherein the third film layer has a third uniform thickness of two monolayers to about 10 nanometers; and annealing the film having the multi-component composition comprising a repeating stack of the first film layer, the second film layer and the third film layer at an annealing temperature to form an approximately homogenous, interdiffused $YZr_xAl_yF_z$ or $YZr_xAl_yO_zF_w$ solid state phase of the first film layer, the second film layer and the third film layer, wherein x, y, z and w have values that are based on the first uniform thickness, the second uniform thickness and the third uniform thickness, and wherein the film having the multi-component composition is discrete from the bare surface of the uncoated chamber component.

2. The method of claim 1, wherein an annealing temperature is configured to maintain the integrity of the uncoated chamber component and refrain from deforming, decomposing, or melting the uncoated chamber component or its bare surface.

3. The method of claim 1, wherein the first film layer is deposited prior to deposition of the second film layer, and wherein the second film layer is deposited over the first film layer.

4. The method of claim 1, wherein the first film layer comprises yttrium oxide, wherein a first precursor of the first set of at least two precursors comprises at least one of tris(N,N-bis(trimethylsilyl)amide)yttrium (III), tris(cyclopentadienyl)yttrium(III), tris(butylcyclopentadienyl)yttrium (III), or tris(2,2,6,6-tetramethyl-3,5-heptanedionato)yttrium (III), and wherein a second precursor of the first set of at least two precursors comprises at least one of $H_2O$, $O_2$, or $O_3$.

5. The method of claim 1, wherein the first film layer comprises yttrium fluoride, wherein the first set of at least two precursors comprise tris(2,2,6,6-tetramethyl-3,5-heptanedionato)yttrium(III) and $TiF_4$.

6. The method of claim 1, wherein the multi-component composition comprises alternating intact layers of at least the first film layer, the second film layer, and the third film layer prior to forming the approximately homogenous, interdiffused solid state phase of the first film layer, the second film layer and the third film layer.

7. The method of claim 1, wherein the first film layer has a different thickness than the second film layer.

8. The method of claim 1, wherein the first film layer and the second film layer have an equal thickness.

9. The method of claim 1, wherein a temperature of the annealing is 800° C.-1800° C.

10. The method of claim 9, wherein a duration of the annealing is approximately 12 hours.

11. The method of claim 1, wherein the first film layer comprises the yttrium oxide.

12. A method comprising:
depositing a first film layer of a yttrium oxide or yttrium fluoride onto a surface of a chamber component for a processing chamber using a first number of repetitions of an atomic layer deposition process;

depositing a second film layer of zirconium oxide or zirconium fluoride onto the surface using a second number of repetitions of the atomic layer deposition process;

depositing an additional film layer of aluminum oxide or aluminum fluoride onto the surface using a third number of repetitions of the atomic layer deposition process; and forming an interdiffused and homogeneous $YZr_xAl_yF_z$ or $YZr_xAl_yO_zF_w$ solid state phase coating composition on the surface wherein x, y, z and w have values that are based on the first number of repetitions of the atomic layer deposition process that are used to deposit the first film layer, the second number of repetitions of the atomic layer deposition process that are used to deposit the second film layer, and the third number of repetitions of the atomic layer deposition process that are used to deposit the additional film layer.

13. The method of claim 12, wherein an annealing temperature is configured to maintain the integrity of the chamber component and refrain from deforming, decomposing, or melting the chamber component or its bare surface.

14. The method of claim 12, wherein the first film layer is deposited prior to deposition of the second film layer, and wherein the second film layer is deposited over the first film layer.

15. The method of claim 12, wherein the first film layer comprises yttrium oxide, wherein a first precursor comprises at least one of tris(N,N-bis(trimethylsilyl)amide)yttrium (III), tris(cyclopentadienyl)yttrium(III), tris(butylcyclopentadienyl)yttrium(III), or tris(2,2,6,6-tetramethyl-3,5-heptanedionato)yttrium(III), and wherein a second precursor comprises at least one of $H_2O$, $O_2$, or $O_3$.

16. The method of claim 12, wherein the first film layer comprises yttrium fluoride, wherein a first set of at least two precursors comprise tris(2,2,6,6-tetramethyl-3,5-heptanedionato)yttrium(III) and $TiF_4$.

17. The method of claim 12, wherein the interdiffused and homogeneous $YZr_xAl_yF_z$ or $YZr_xAl_yO_zF_w$ solid state phase coating composition comprises alternating intact layers of at least the first film layer, the second film layer, and the additional film layer prior to forming an approximately homogenous, interdiffused solid state phase of the first film layer, the second film layer and the third film layer.

18. The method of claim 12, further comprising annealing, wherein a temperature of the annealing is 800° C.-1800° C.

19. The method of claim 12, wherein the chamber component has a portion having a length to diameter (L:D) aspect ratio ranging from about 50:1 to about 100:1 and wherein the surface is an interior portion of the portion having the L:D aspect ratio ranging from about 50:1 to about 100:1.

* * * * *